US008847239B2

(12) United States Patent
Lin

(10) Patent No.: US 8,847,239 B2
(45) Date of Patent: Sep. 30, 2014

(54) AC LED DEVICE AND METHOD FOR FABRICATING THE SAME

(75) Inventor: Ming-Te Lin, Taipei County (TW)

(73) Assignee: Epistar Corporation, Hsinchu (TW)

( * ) Notice: Subject to any disclaimer, the term of this patent is extended or adjusted under 35 U.S.C. 154(b) by 555 days.

(21) Appl. No.: 12/499,073

(22) Filed: Jul. 7, 2009

(65) Prior Publication Data
US 2010/0006868 A1 Jan. 14, 2010
US 2014/0145215 A9 May 29, 2014

Related U.S. Application Data

(60) Continuation-in-part of application No. 12/021,072, filed on Jan. 28, 2008, now Pat. No. 8,503,500, which is a division of application No. 11/245,255, filed on Oct. 7, 2005, now Pat. No. 7,474,681.

(60) Provisional application No. 61/078,844, filed on Jul. 8, 2008.

(30) Foreign Application Priority Data

May 13, 2005 (TW) ................ 94115514 A

(51) Int. Cl.
*H01L 27/15* (2006.01)
*H05B 33/08* (2006.01)
*F21K 99/00* (2010.01)
*H01L 25/075* (2006.01)

(52) U.S. Cl.
CPC ............. *H05B 33/0821* (2013.01); *F21K 9/00* (2013.01); *H01L 25/0753* (2013.01); *Y02B 20/342* (2013.01)
USPC .......................................... 257/79

(58) Field of Classification Search
CPC ................ H05B 33/0803; F21Y 2105/003; Y02B 20/36; H01L 25/0753
USPC .......................................... 257/79
See application file for complete search history.

(56) References Cited

U.S. PATENT DOCUMENTS

| 5,278,432 | A | * | 1/1994 | Ignatius et al. | 257/88 |
| 7,679,292 | B2 | * | 3/2010 | Allen et al. | 315/200 R |
| 8,049,709 | B2 | * | 11/2011 | Roberts et al. | 345/102 |
| 2005/0168156 | A1 | * | 8/2005 | Li et al. | 315/185 R |
| 2006/0163589 | A1 | * | 7/2006 | Fan et al. | 257/88 |
| 2006/0256826 | A1 | | 11/2006 | Lin et al. | |
| 2007/0080355 | A1 | * | 4/2007 | Lin et al. | 257/81 |

* cited by examiner

*Primary Examiner* — Shaun Campbell
(74) *Attorney, Agent, or Firm* — Muncy, Geissler, Olds & Lowe, P.C.

(57) ABSTRACT

An LED device includes a substrate including a first and second light emitting modules, and first and second opposite sides. The first light emitting module includes a first conductive electrode located adjacent to the first side, a second conductive electrode located adjacent to the second side, and a first plurality of light emitting micro diodes electrically connected in the form of a plurality of serially connected bridge rectifiers between the first conductive electrode and the second conductive electrode. The second light emitting module includes a third conductive electrode located adjacent to the first side, a fourth conductive electrode adjacent to the second side, and a second plurality of light emitting micro diodes electrically connected in the form of a plurality of serially connected bridge rectifiers between the third conductive electrode and the fourth conductive electrode. The first, second, third, and fourth conductive electrodes are physically separated from each other.

9 Claims, 11 Drawing Sheets

AC LED DEVICE AND METHOD FOR FABRICATING THE SAME

CROSS REFERENCE TO RELATED APPLICATIONS

This application claims the benefit of U.S. Provisional Application No. 61/078,844 filed Jul. 8, 2008, the entirety of which is incorporated by reference herein.

BACKGROUND OF THE INVENTION

1. Field of the Invention

The present disclosure relates to alternating current light emitting diodes (AC LED) device, and more particularly, relates to an AC LED device without passive devices.

2. Description of the Related Art

Light emitting diodes (LED) devices have advantages such as long lifespan and energy efficiency, when compared to other illumination sources. However, conventional LED devices, driven by direct current (DC), require an additional current transducer, to transform alternating current (AC) from an AC power source to direct current. Therefore, a conventional DC device has a larger volume, a higher cost and poorer energy efficiency when compared to a conventional AC LED device. However, conventional LEDs arranged in an AC LED device have poor stability due to variations in driving voltage to the LEDs. For example, if the LEDs of an AC LED device have a small driving voltage, an over-current problem occurs in the circuit while receiving the fixed AC power. Thus, generally, an additional resistor device is coupled to the AC LED device to adjust applied voltage thereto, which increases volume and costs.

A novel AC LED device, minimizing driving voltage variations therein and method for fabricating the same are desirable.

BRIEF SUMMARY OF INVENTION

An LED device comprises: a substrate comprising a first light emitting module, a second light emitting module, a first side, and a second side opposite to the first side; wherein the first light emitting module comprises a first conductive electrode located adjacent to eh first side, a second conductive electrode located adjacent to the second side, and a first plurality of light emitting micro diodes electrically connected in the form of a plurality of serially connected bridge rectifiers between the first conductive electrode and the second conductive electrode; wherein the second light emitting module comprises a third conductive electrode located adjacent to the first side, a fourth conductive electrode adjacent to the second side, and a second plurality of light emitting micro diodes electrically connected in the form of a plurality of serially connected bridge rectifiers between the third conductive electrode and the fourth conductive electrode; and wherein the first, second, third, and fourth conductive electrodes are physically separated from each other for bonding to external bonding structures.

A detailed description is given in the following embodiments with reference to the accompanying drawings.

BRIEF DESCRIPTION OF DRAWINGS

The present disclosure can be more fully understood by reading the subsequent detailed description and examples with references made to the accompanying drawings, wherein.

DETAILED DESCRIPTION OF INVENTION

Figure 1:
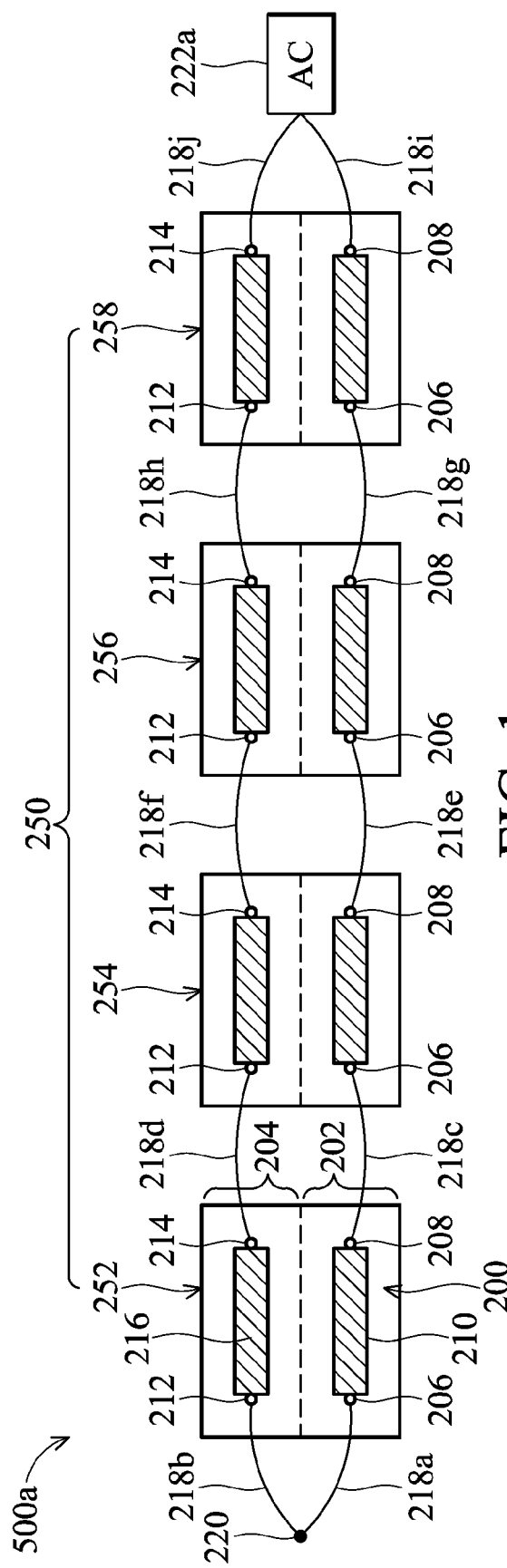
FIG. 1 shows one exemplary embodiment of an AC LED device of the present disclosure.

The following description is of a mode of carrying out the present disclosure. This description is made for the purpose of illustrating the general principles of the present disclosure and should not be taken in a limiting sense. The scope of the present disclosure is best determined by reference to the appended claims. Wherever possible, the same reference numbers are used in the drawings and the descriptions to refer the same or like parts.

Accordingly, some exemplary embodiments of an alternating current (AC) light emitting diodes (LED) device are provided. FIG. 1 shows one exemplary embodiment of an AC LED device 500a of the present disclosure. As shown in FIG. 1, the AC LED device 500a comprises a plurality of separated AC LED unit chips 250, for example, AC LED unit chips 252, 254, 256 and 258. In one embodiment, the AC LED unit chips 252, 254, 256 and 258 may be the same AC LED unit chip. The AC LED unit chip 252 comprises a substrate 200 having two portions 202 and 204. The portion 202 comprises a first light emitting module 210, which is composed of a plurality of light emitting micro diodes (not shown), electrically connected between a first conductive electrode 206 and a second conductive electrode 208. The portion 204 comprises a second light emitting module 216, which is composed of a plurality of light emitting micro diodes (not shown), electrically connected between a third conductive electrode 212 and a fourth conductive electrode 214. In one embodiment, the first light emitting module 210 may have the same circuitry as the second light emitting module 216. A plurality of conductive wires 218a to 218j are used to electrically connect the separated AC LED unit chips 250, a node 220 and an alternating current (AC) power supply 222a to each other. As shown in FIG. 1, two terminals of the conductive wire 218a are electrically connected to the first conductive electrode 206 of the AC LED unit chip 252 and the node 220, respectively. Two terminals of the conductive wire 218b are electrically connected to the third conductive electrode 212 of the AC LED unit chip 252 and the node 220, respectively. Two terminals of the conductive wire 218c are electrically connected to the second conductive electrode 208 of the AC LED unit chip 252 and the first conductive electrode 206 of the adjacent AC LED unit chip 254, respectively. Two terminals of the conductive wire 218d are electrically connected to the fourth conductive electrode 214 of the AC LED unit chip 252 and the third conductive electrode 212 of the adjacent AC LED unit chip 254, respectively. Similarly, the conductive wire 218e is respectively and electrically connected to the second conductive electrode 208 of the AC LED unit chip 254 and the first conductive electrode 206 of the adjacent AC LED unit chip 256. The conductive wire 218f is respectively and electrically connected to the fourth conductive electrode 214 of the AC LED unit chip 254 and the third conductive electrode 212 of the adjacent AC LED unit chip 256. The conductive wire 218g is respectively and electrically connected to the second conductive electrode 208 of the AC LED unit chip 256 and the first conductive electrode 206 of the adjacent AC LED unit chip 258. The conductive wire 218h is respectively and electrically connected to the fourth conductive electrode 214 of the AC LED unit chip 256 and the third conductive electrode 212 of the adjacent AC LED unit chip 258. The conductive wire 218i is respectively and electrically connected to the second conductive electrode 208 of the AC LED unit chip 258 and the alternating current (AC) power supply 222a. The conductive wire 218j is respectively and electrically connected to the fourth conductive electrode 214 of the AC LED unit chip 258 and the alternating current (AC) power supply 222a. Therefore, an LED module chain formed by the first light emitting modules 210 of each of the AC LED unit chips 250 series connected and another LED module chain formed by the second light emitting modules 216 of each of the AC LED unit chips 250, are, parallel connected between the AC power supply 222a and the node 220, and form the AC LED device 500a.

Figure 2A:
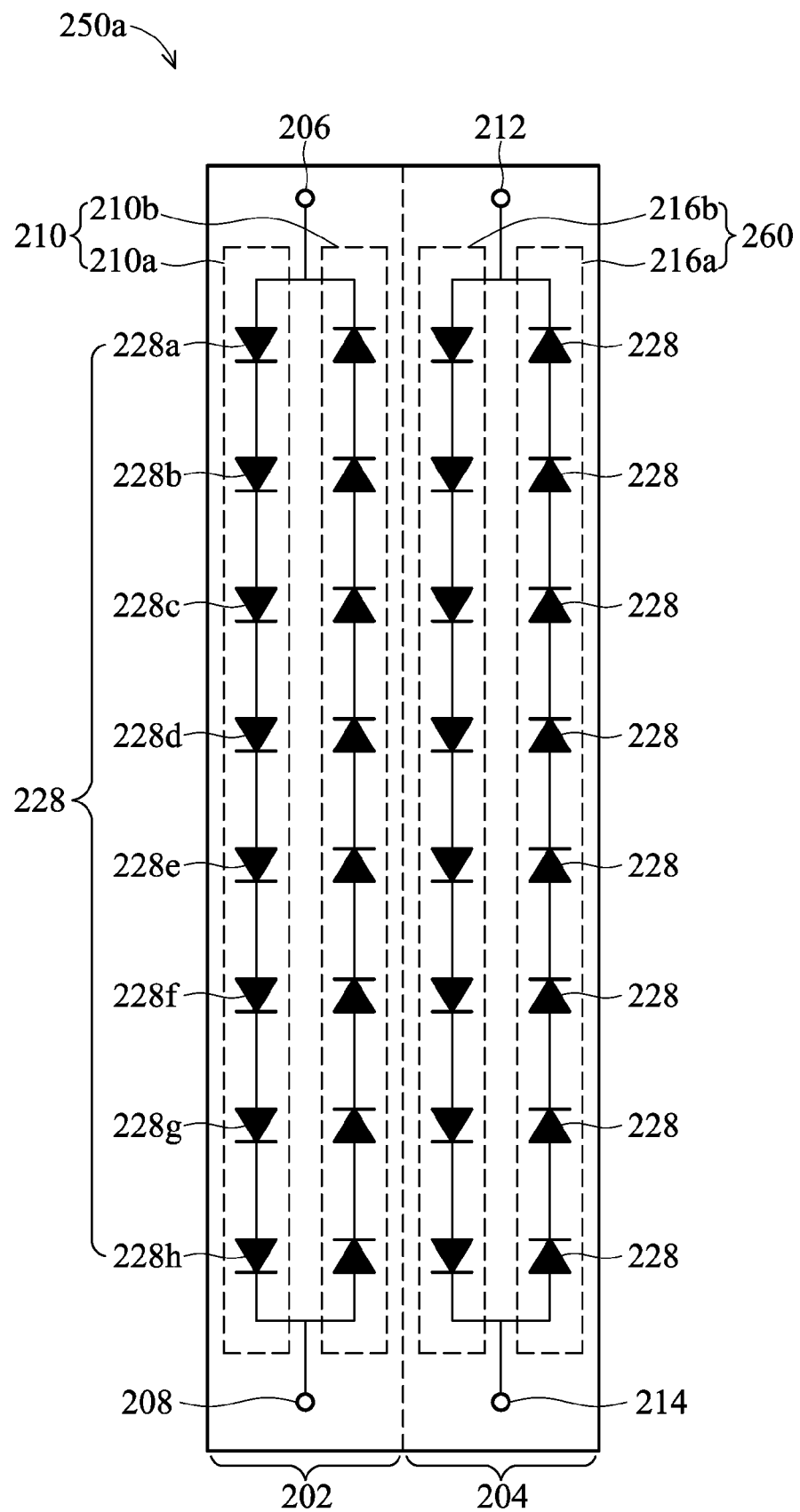
FIGS. 2a to 2b show circuitry designs of exemplary embodiments of an AC LED unit chip of the present disclosure.
Figure 2B:
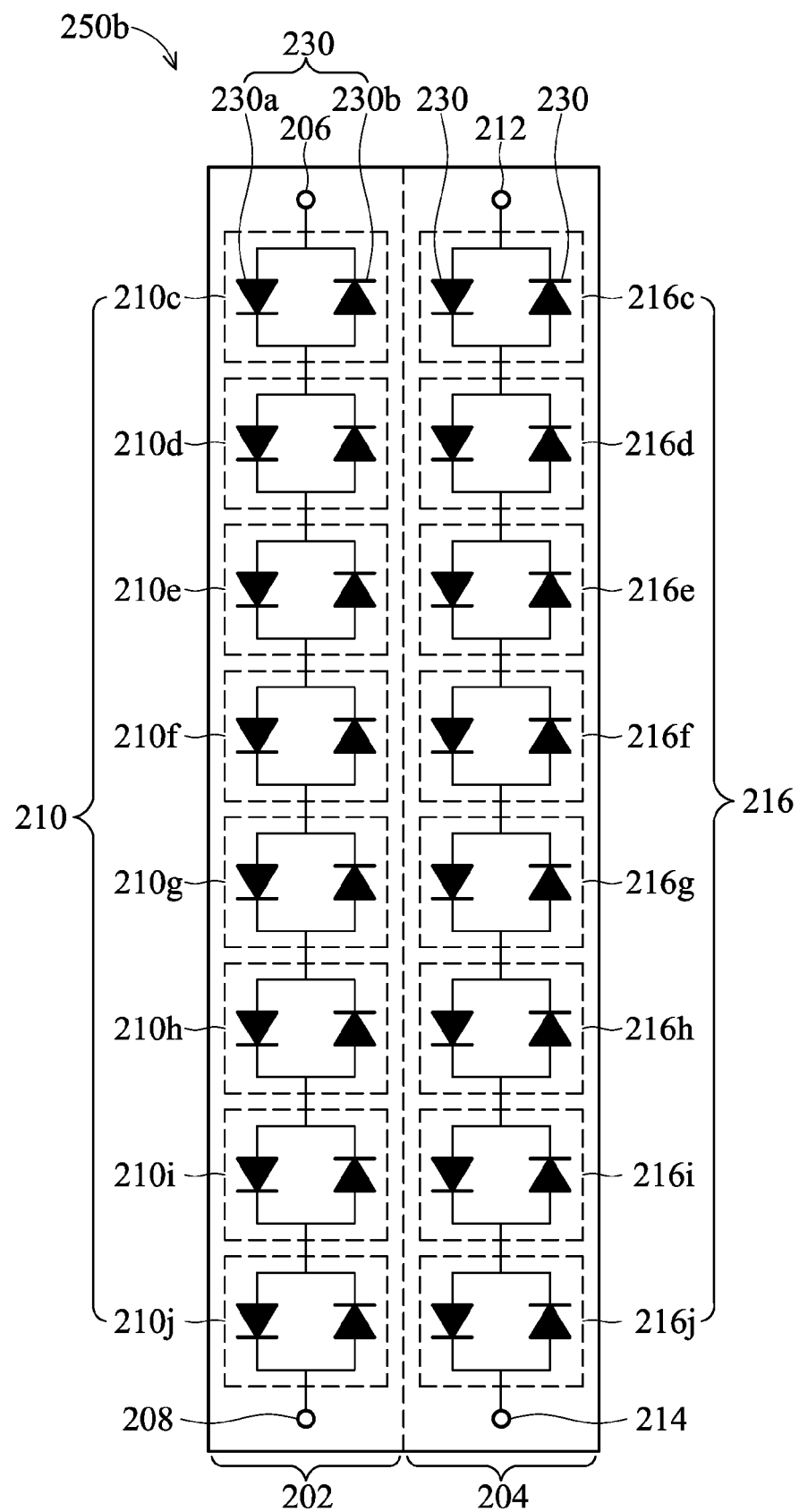

In one embodiment, the light emitting module of the AC LED unit chip may have various circuitry designs to achieve requirements for adjusting the amount of the light emitting micro diodes that emit light during a positive half cycle of an AC charge, so that they equal to the light emitting micro diodes that emit light during a negative half cycle of an AC charge. FIGS. 2a to 2b show circuitry designs of exemplary embodiments of an AC LED unit chip of the present disclosure. FIG. 2a shows a circuitry design of one embodiment of light emitting modules 210 and 216 of an AC LED unit chip 250a of the present disclosure. The first light emitting module 210 is electrically connected to the first conductive electrode 206 and the second conductive electrode 208. The first light emitting module 210 comprises two light emitting units 210a and 210b, parallel connected, wherein the light emitting unit 210a is composed of eight light emitting micro diodes 228, for example, the light emitting micro diodes 228a to 228h, connected in series. As shown in FIG. 2a, an anode of the light emitting micro diodes 228a is electrically connected to the first conductive electrode 206, a cathode of the light emitting micro diodes 228a is electrically connected to an anode of the adjacent light emitting micro diodes 228b, a cathode of the light emitting micro diodes 228b is electrically connected to an anode of the adjacent light emitting micro diodes 228c, and so on . . . , and a cathode of the light emitting micro diodes 228h is electrically connected to the second conductive electrode 208. Thus, each light emitting micro diodes 228 of the light emitting unit 210a is coupled in a forward conduction direction from the first conductive electrode 206 to the second conductive electrode 208. Similarly, the light emitting unit 210b is composed of eight light emitting micro diodes 228. Each light emitting micro diodes 228 of the light emitting unit 210b is coupled in a forward conduction direction from the second conductive electrode 208 to the first conductive electrode 206.

As shown in FIG. 2a, the portion 204 of the AC LED unit chip 250a comprises a second light emitting module 216 electrically connected the third conductive electrode 212 and a fourth conductive electrode 214. The second light emitting module 216 may have the same circuitry design as the light emitting modules 210. The second light emitting module 216 comprises two light emitting units 216a and 216b, parallel connected, wherein the light emitting unit 216a is composed of eight light emitting micro diodes 228 connected in series. Each light emitting micro diodes 228 of the light emitting unit 216a is coupled in a forward conduction direction from the fourth conductive electrode 214 to the third conductive electrode 212. Similar to the light emitting unit 216a, the light emitting unit 216b is composed of eight light emitting micro diodes 228 connected in series. Each light emitting micro diodes 228 of the light emitting unit 216b is coupled in a forward conduction direction from the third conductive electrode 212 to the fourth conductive electrode 214.

The described circuitry design of the light emitting module having two light emitting units allows the amount of light emitting micro diodes emitting light during a positive half cycle of an AC charge to equal to that during a negative half cycle of an AC charge. For example, if the AC LED unit chip 250a is coupled to an AC power supply, the light emitting module 210 allows the eight light emitting micro diodes of the light emitting unit 210a to emit light during a positive half cycle of an AC charge by the AC power supply and allows the eight light emitting micro diodes of the light emitting unit 210b to emit light during a negative half cycle of an AC charge by the AC power supply.

Generally, a driving voltage of a light emitting micro diode is about 5V. Therefore, a driving voltage of the light emitting modules 210 or 216 composed of eight light emitting micro diodes is about 40V. If the AC LED unit chips of the AC LED device 500a as shown the FIG. 1 are composed of the four AC LED unit chips 250, a driving voltage of each AC LED unit chips 250 is about 40V, and a peak voltage (Vp) of the AC LED device 500a is about 160V. Therefore, the AC power supply 222a has a root mean square voltage (Vrms) of about 110V. Thus, a connection type of the AC LED device 500a may receive 110 Vrms by an AC power supply, and ten conductive wires are needed.

In one embodiment, each light emitting module of each portion of the AC LED unit chip 250a may have the same circuitry design and the same amount of light emitting micro diodes. Additionally, each light emitting unit of the same light emitting module may have the same amount of light emitting micro diodes. Alternatively, the amount of light emitting micro diodes of each light emitting unit is according to design, but not limited to the disclosure herein. For example, each light emitting unit of the AC LED unit chip 250a may have five to twelve light emitting micro diodes. Therefore, the light emitting module of the AC LED unit chip 250a would allow for five to twelve of the light emitting micro diodes to emit light during a positive half cycle of an AC charge, and the same amount for a negative half cycle of an AC charge. A driving voltage of the AC LED unit chip 250a is also according to design, but not limited to the disclosure herein.

In another embodiment, the amount of light emitting units of each light emitting module of the AC LED unit chip is not limited. FIG. 2b shows a circuitry design of another embodiment of light emitting modules 210 and 216 of an AC LED unit chip 250b of the present disclosure. In one embodiment, a driving voltage of the light emitting modules 210 or 216 of the AC LED unit chip 250b is about 40V. Alternatively, a driving voltage of the light emitting module of the AC LED unit chip 250b is according to design, but not limited to the disclosure herein. The first light emitting module 210 is electrically connected to the first conductive electrode 206 and the second conductive electrode 208. The first light emitting module 210 comprises eight light emitting units 210c to 210j series connected. Each light emitting unit, for example, the light emitting unit 210c, is composed of two light emitting micro diodes 230, for example, light emitting micro diodes 230a and 230b, parallel connected. The light emitting micro diodes 230a of the light emitting unit 210c is coupled in a forward conduction direction from the first conductive electrode 206 to the second conductive electrode 208, but the light emitting micro diodes 230b of the light emitting unit 210c is coupled in a forward conduction direction from the second conductive electrode 208 to the first conductive electrode 206. In one embodiment, the eight light emitting units 210c to 210j may have the same circuitry design.

As shown in FIG. 2b, the portion 204 of the AC LED unit chip 250b comprises a second light emitting module 216 electrically connected to the third conductive electrode 212 and the fourth conductive electrode 214. The second light emitting module 216 may have the same circuitry design as the light emitting modules 210. Also, the second light emitting module 216 comprises eight light emitting units 216c to 216j series connected from the third conductive electrode 212 to the fourth conductive electrode 214. Each light emitting unit 216 is composed of two light emitting micro diodes 230, parallel connected. One of the light emitting micro diodes 230 of the light emitting units 216 is coupled in a forward conduction direction from the third conductive electrode 212 to the fourth conductive electrode 214, but another one of the light emitting micro diodes 230 of the same light emitting units 216 is coupled in a forward conduction direction from the fourth conductive electrode 214 to the third conductive electrode 212. In this embodiment, each light emitting module of each portion of the AC LED unit chip 250b may have the same circuitry design and the same amount of light emitting micro diodes. Each light emitting unit of the same light emitting module may have the same amount of light emitting micro diodes. and the amount of the light emitting units of each portion of the AC LED unit chip 250b is according to design, but not limited to the disclosure herein. For example, each light emitting module of the AC LED unit chip 250b may have five to twelve light emitting units. In this embodiment, the light emitting module allows the amount of light emitting micro diodes to emit light during a positive half cycle of an AC charge is equal to that during a negative half cycle of an AC charge. For example, the light emitting module would allow five to twelve of the light emitting micro diodes to emit light during a positive half cycle of an AC charge, and the same amount for a negative half cycle of an AC charge. Additionally, the two light emitting micro diodes of one light emitting unit may alternatively emit light during a positive and a negative half cycle of an AC charge. For example, the light emitting micro diodes 230a of the light emitting unit 210c may emit light if the first conductive electrode 206 receives a positive half cycle of an AC charge, and light emitting micro diodes 230b may emit light if the first conductive electrode 206 receives a negative half cycle of an AC charge.

Figure 3A:
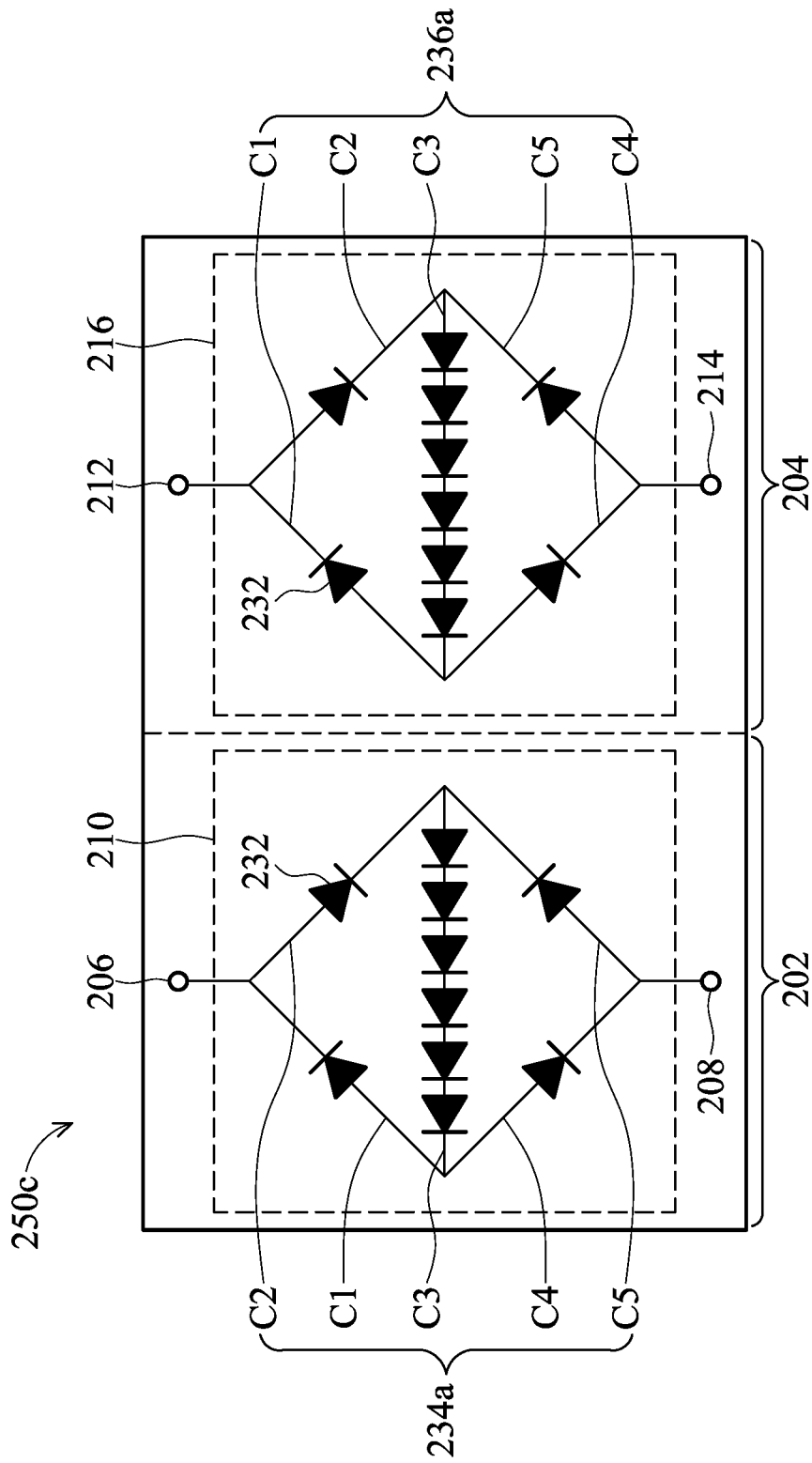
FIGS. 3a to 3c show circuitry designs of exemplary embodiments of an AC LED unit chip of the present disclosure.
Figure 3B:
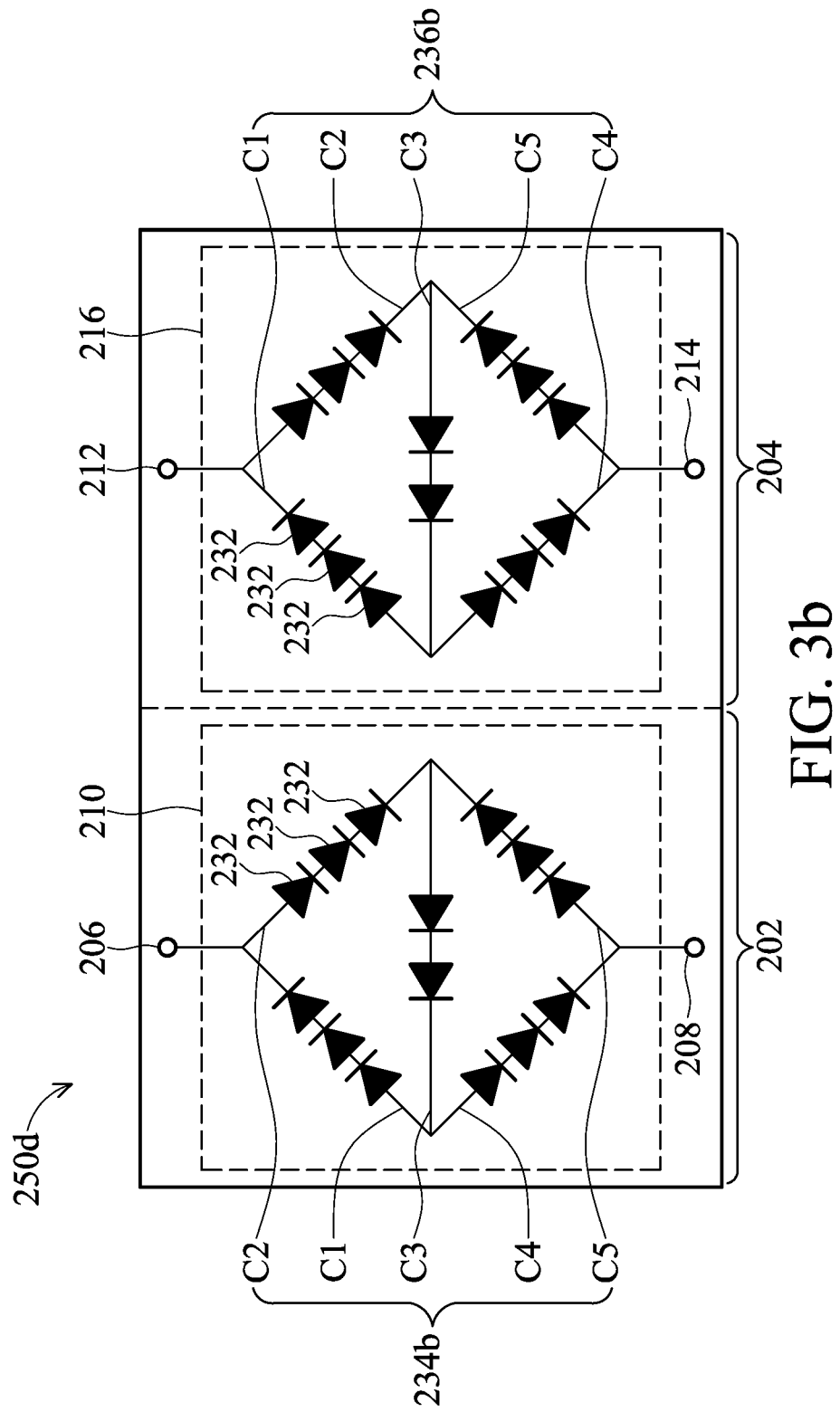
Figure 3C:
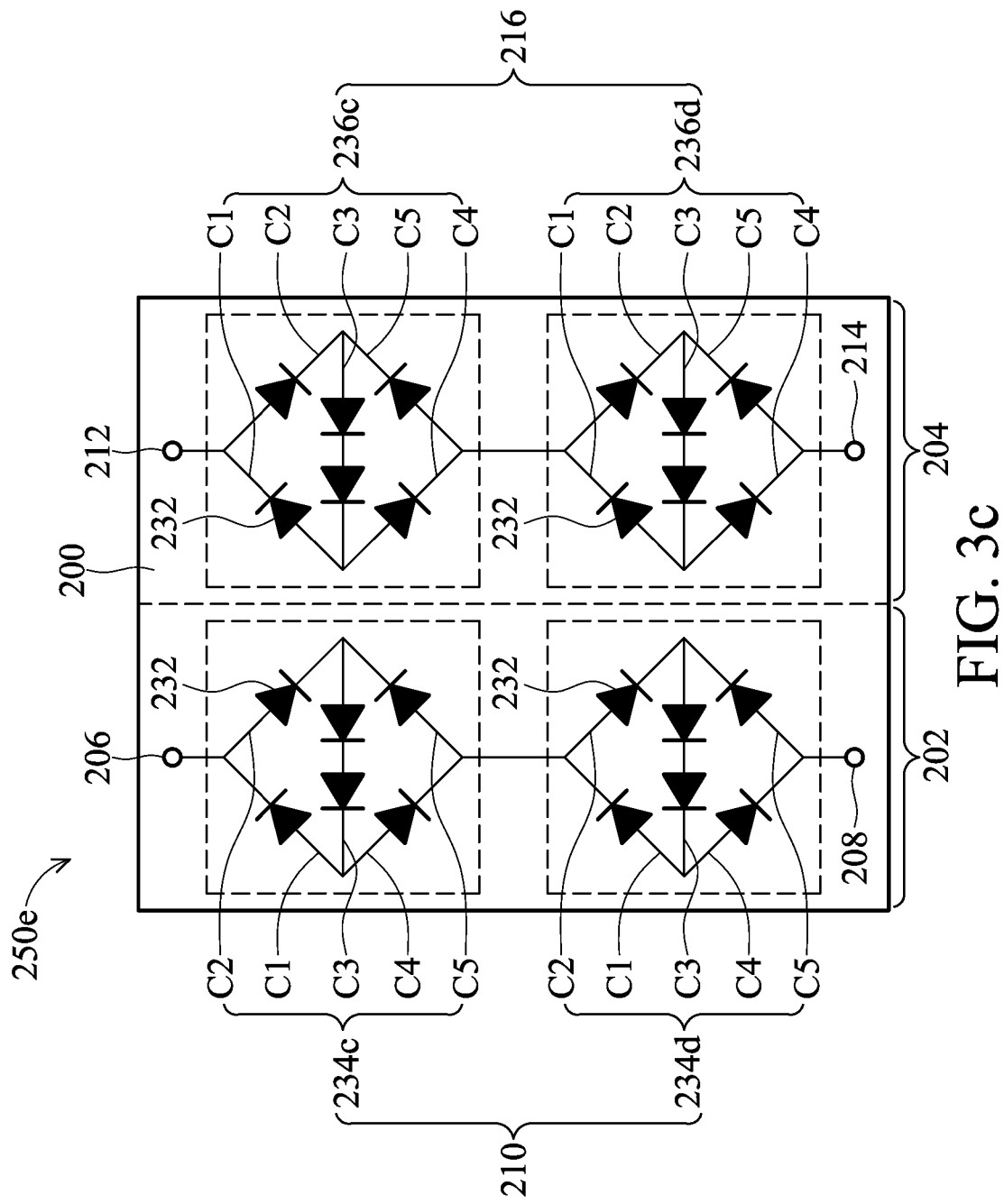

FIGS. 3a to 3c show circuitry designs of exemplary embodiments of an AC LED unit chip of the present disclosure. In embodiments as shown in FIGS. 3a to 3c, a light emitting module may be composed of one or more bridge light emitting units, wherein a circuit structure of the light emitting micro diodes of each bridge light emitting unit is arranged according to a bridge rectifier. Also, a driving voltage of each light emitting module of each AC LED unit chip as shown in FIGS. 3a to 3c is about 40V. Alternatively, a driving voltage of each light emitting module of each AC LED unit chip as shown in FIGS. 3a to 3c is according to design, but not limited to the disclosure herein.

FIG. 3a shows a circuitry design of one embodiment of bridge light emitting units 234a and 236a of light emitting modules 210 and 216 of an AC LED unit chip 250c of the present disclosure. The first light emitting module 210 comprises only one bridge light emitting unit 234a. The bridge light emitting unit 234a has a circuit configuration in a bridge rectifier composed of a first circuit C1, a second circuit C2, a third circuit C3, a fourth circuit C4 and a fifth circuit C5. As shown in FIG. 3a, each of the first circuit C1, the second circuit C2, the fourth circuit C4 and the fifth circuit C5 comprises one light emitting micro diode 232. The third circuit C3 comprises six light emitting micro diodes 232 series connected. Similarly, the bridge light emitting unit 236a of the second light emitting module 216 may have the same circuitry design as the bridge light emitting unit 234a of the light emitting modules 210. The bridge light emitting unit 236a has a circuit configuration in a bridge rectifier composed of a first circuit C1, a second circuit C2, a third circuit C3, a fourth circuit C4 and a fifth circuit C5. In the bridge light emitting unit 236a, each of the first circuit C1, the second circuit C2, the fourth circuit C4 and the fifth circuit C5 comprises one light emitting micro diode 232, respectively. The third circuit C3 comprises six light emitting micro diodes 232 series connected. The described circuitry design of the bridge light emitting unit 234a or 236a allows the amount of light emitting micro diodes emitting light during a positive half cycle of an AC charge to equal to that during a negative half cycle of an AC charge. For example, if the first conductive electrode 206 and the second conductive electrode 208 of the AC LED unit chip 250c are coupled to an AC power supply, the light emitting module 210 allows the eight light emitting micro diodes 232, which comprise one light emitting micro diode 232 of the second circuit C2, six light emitting micro diodes 232 of the third circuit C3 and one light emitting micro diode of the fourth circuit C4, to emit light during a positive half cycle of an AC charge by the AC power supply, and the light emitting module 210 allows the eight light emitting micro diodes, which comprise one light emitting micro diode 232 of the fifth circuit C5, six light emitting micro diodes 232 of the third circuit C3 and one light emitting micro diode 232 of the first circuit C1, to emit light during a negative half cycle of an AC charge by the AC power supply. If the third conductive electrode 212 and the fourth conductive electrode 214 of the AC LED unit chip 250c are coupled to an AC power supply, the light emitting module 216 allows the eight light emitting micro diodes 232, which comprise one light emitting micro diode 232 of the second circuit C2, six light emitting micro diodes 232 of the third circuit C3 and one light emitting micro diode 232 of the fourth circuit C4, to emit light during a positive half cycle of an AC charge by the AC power supply, and the light emitting module 216 allows the eight light emitting micro diodes 232, which comprise one light emitting micro diode 232 of the fifth circuit C5, six light emitting micro diodes 232 of the third circuit C3 and one light emitting micro diode 232 of the first circuit C1, to emit light during a negative half cycle of an AC charge by the AC power supply. Therefore, in the bridge light emitting units 234a or 236a, the light emitting micro diodes 232 of the third circuit C3 may emit light during a positive or negative half cycle of an AC charge. Additionally, the light emitting micro diodes 232 of the first, second, fourth and fifth circuits C1, C2, C4 and C5 may alternatively emit light during a positive or negative half cycle of an AC charge.

Alternatively, the light emitting micro diodes of each circuit of the bridge light emitting unit may have various designs, which would only allow the amount of light emitting micro diodes emitting light during a positive half cycle of an AC charge to equal to that during a negative half cycle of an AC charge. FIG. 3b shows a circuitry design of another embodiment of bridge light emitting units 234b and 236b of light emitting modules 210 and 216 of an AC LED unit chip 250d of the present disclosure. As shown in FIG. 3b, a first circuit C1, a second circuit C2, a fourth circuit C4 and a fifth circuit C5 of the bridge light emitting units 234b comprise three light emitting micro diodes 232 series connected, respectively. A third circuit C3 comprises two light emitting micro diodes 232 series connected. Similarly, the bridge light emitting unit 236b of the second light emitting module 216 may have the same circuitry design as the bridge light emitting unit 234b of the light emitting modules 210. Therefore, the described circuitry design of the bridge light emitting unit 234b of the light emitting module 210 allows the eight light emitting micro diodes 232, which comprise three light emitting micro diodes 232 of the second circuit C2, two light emitting micro diodes 232 of the third circuit C3 and three light emitting micro diodes 232 of the fourth circuit C4, to emit light during a positive half cycle of an AC charge, and the bridge light emitting unit 234b allows the eight light emitting micro diodes 232, which comprise three light emitting micro diodes 232 of the fifth circuit C5, two light emitting micro diodes 232 of the third circuit C3 and three light emitting micro diodes 232 of the first circuit C1, to emit light during a negative half cycle of an AC charge.

Also, the described circuitry design of the bridge light emitting unit 236b of the light emitting module 216 allows the eight light emitting micro diodes 232, which comprise three light emitting micro diodes 232 of the second circuit C2, two light emitting micro diodes 232 of the third circuit C3 and three light emitting micro diodes 232 of the fourth circuit C4, to emit light during a positive half cycle of an AC charge, and the bridge light emitting unit 236b of the light emitting module 216 allows the eight light emitting micro diodes 232, which comprise three light emitting micro diodes 232 of the fifth circuit C5, two light emitting micro diodes 232 of the third circuit C3 and three light emitting micro diodes 232 of the first circuit C1, to emit light during a negative half cycle of an AC charge.

Also, in the bridge light emitting units 234b or 236b, the light emitting micro diodes 232 of the third circuit C3 may emit light during a positive or negative half cycle of an AC charge. Additionally, the light emitting micro diodes 232 of the first, second, fourth and fifth circuits C1, C2, C4 and C5 may alternatively emit light during a positive or negative half cycle of an AC charge.

In other embodiments, the light emitting module may be composed of a plurality of the bridge light emitting units. FIG. 3c shows a circuitry design of another embodiment of bridge light emitting units 234c, 234d, 236c and 236d of light emitting modules 210 and 216 of an AC LED unit chip 250e of the present disclosure. The first light emitting module 210 comprises two bridge light emitting units 234c and 234d series connected from the first conductive electrode 206 to the second conductive electrode 208. Each of the bridge light emitting units 234c and 234d has a circuit configuration in a bridge rectifier composed of a first circuit C1, a second circuit C2, a third circuit C3, a fourth circuit C4 and a fifth circuit C5. As shown in FIG. 3c, each of the first circuit C1, the second circuit C2, the fourth circuit C4 and the fifth circuit C5 comprises one light emitting micro diode 232. The third circuit C3 comprises two light emitting micro diodes 232 series connected. Similarly, the bridge light emitting units 236c and 236d of the second light emitting module 216 may have the same circuitry design as the bridge light emitting units 234c and 234d of the light emitting modules 210. Therefore, the described circuitry design of the light emitting module 210 comprising the bridge light emitting units 234c and 234d allows the eight light emitting micro diodes 232, which comprise one light emitting micro diode 232 of the second circuit C2 of the bridge light emitting units 234c and 234d, two light emitting micro diodes 232 in the third circuit C3 of the bridge light emitting units 234c and 234d and one light emitting micro diode 232 in the fourth circuit C4 of the bridge light emitting units 234c and 234d, to emit light during a positive half cycle of an AC charge, and the bridge light emitting units 234c and 234d allow the eight light emitting micro diodes 232, which comprise one light emitting micro diode 232 of the fifth circuit C5 of the bridge light emitting units 234c and 234d, two light emitting micro diodes 232 of the third circuit C3 of the bridge light emitting units 234c and 234d and one light emitting micro diode 232 of the first circuit C1 of the bridge light emitting units 234c and 234d, to emit light during a negative half cycle of an AC charge.

Also, the described circuitry design of the light emitting module 216 comprising the bridge light emitting units 236c and 236d allows the eight light emitting micro diodes 232, which comprise one light emitting micro diodes 232 of the second circuit C2 of the bridge light emitting units 236c and 236d, two light emitting micro diodes 232 in the third circuit C3 of the bridge light emitting units 236c and 236d and one light emitting micro diodes 232 in the fourth circuit C4 of the bridge light emitting units 236c and 236d, to emit light during a positive half cycle of an AC charge, and the bridge light emitting units 236c and 236d allows the eight light emitting micro diodes 232, which comprise one light emitting micro diodes 232 in the fifth circuit C5 of the bridge light emitting units 236c and 236d, two light emitting micro diodes 232 in the third circuit C3 of the bridge light emitting units 236c and 236d and one light emitting micro diodes 232 in the first circuit C1 of the bridge light emitting units 236c and 236d, to emit light during a negative half cycle of an AC charge.

Also, in the bridge light emitting units 234c, 234d, 236c or 236d, the light emitting micro diodes 232 of the third circuit C3 may emit light during a positive or negative half cycle of an AC charge. Additionally, the light emitting micro diodes 232 of the first, second, fourth and fifth circuits C1, C2, C4 and C5 may alternatively emit light during a positive or negative half cycle of an AC charge.

The described circuitry design of the light emitting module composed of one or more bridge light emitting units allows the amount of light emitting micro diodes emitting light during a positive half cycle of an AC charge to equal to that during a negative half cycle of an AC charge. The amount of the bridge light emitting units of each light emitting module is according to design, but not limited to the disclosure herein. Also, the amount of the light emitting micro diodes of each circuit of each bridge light emitting unit is according to design, but not limited to the disclosure herein. For example, each bridge light emitting unit of the AC LED unit chip may allow five to twelve light emitting micro diodes to emit light during a positive half cycle and a negative half cycle of an AC charge, and all the light emitting micro diodes in the third C3 of the bridge light emitting unit may emit light during a positive and negative half cycles of an AC charge.

Figure 4A:
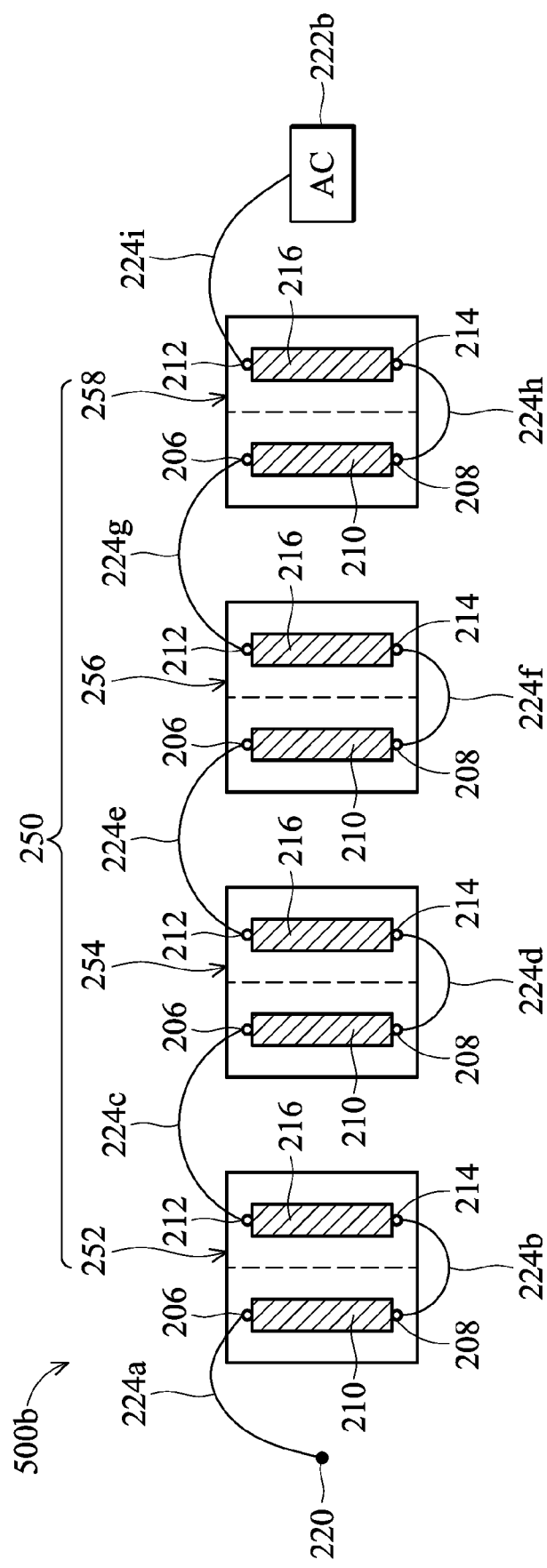
FIGS. 4a to 4c show other exemplary embodiments of an AC LED device of the present disclosure.
Figure 4B:
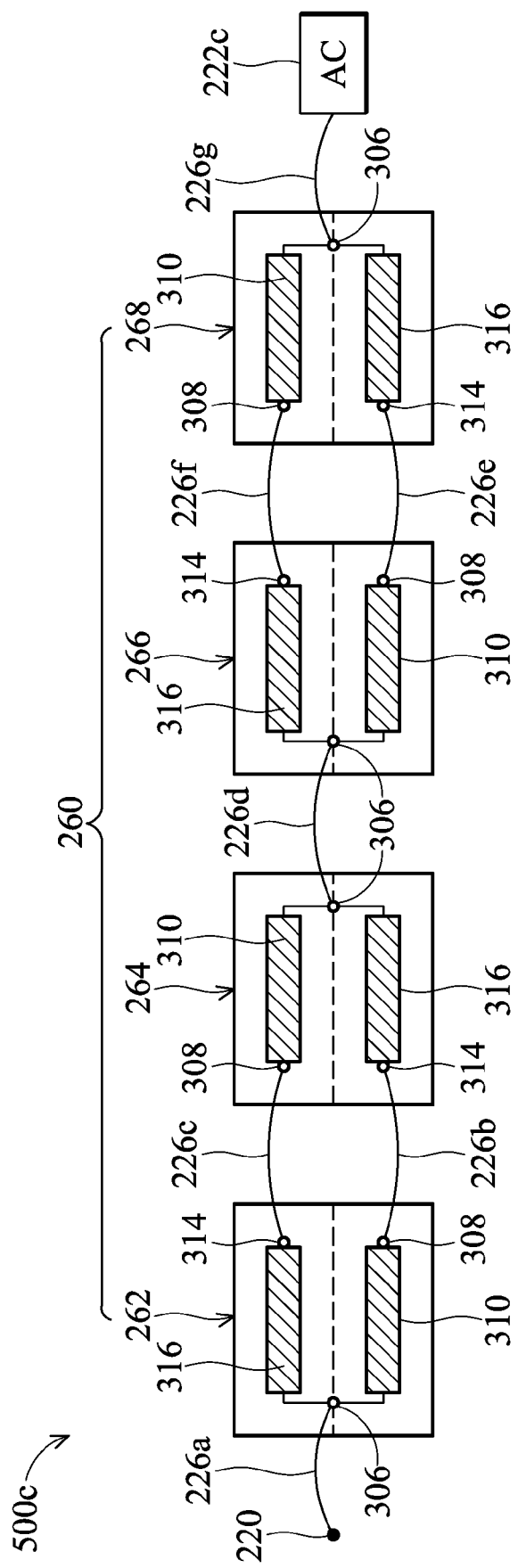
Figure 4C:
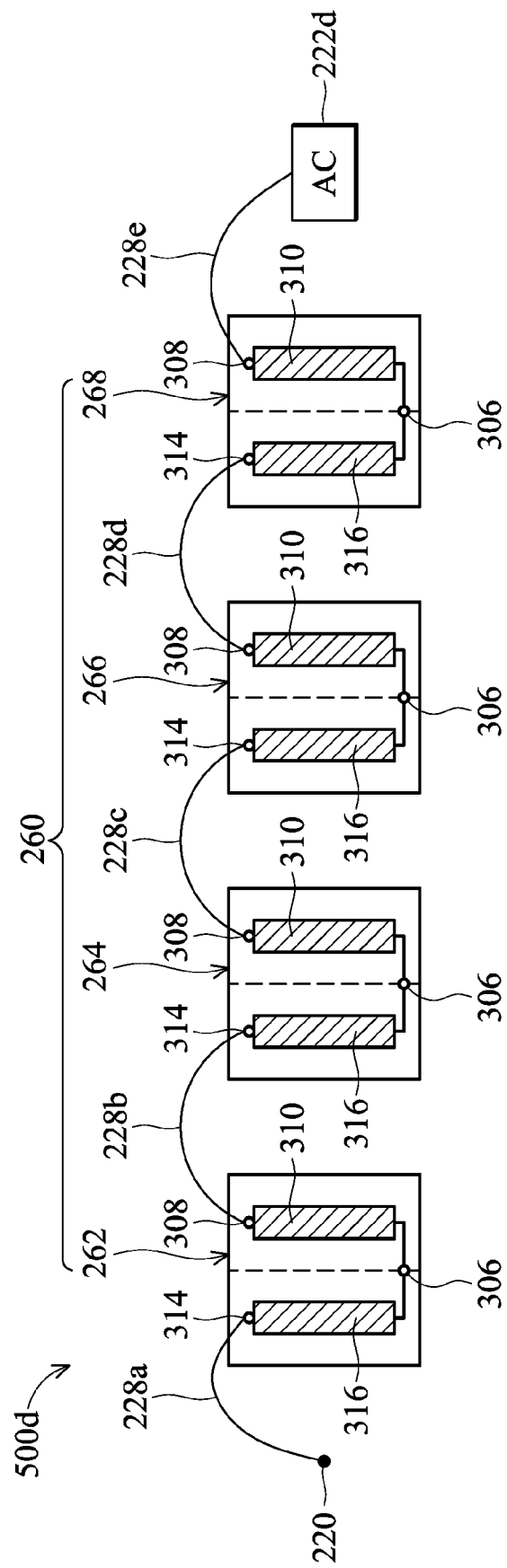

The described AC LED unit chips may have various connection types to form an AC LED device, receiving different applied voltages by an AC power supply. FIGS. 4a to 4c show other exemplary embodiments of an AC LED device of the present disclosure. In one embodiment, a driving voltage of each light emitting module of each AC LED unit chip as shown in FIGS. 4a to 4c is about 40V. Alternatively, a driving voltage of each light emitting module of each AC LED unit chip as shown in FIGS. 4a to 4c is according to design, but not limited to the disclosure herein. As shown in FIG. 4a, the AC LED device 500b comprises a plurality of separated AC LED unit chips 250, for example, AC LED unit chips 252, 254, 256 and 258. In one embodiment, the AC LED unit chips 252, 254, 256 and 258 may be the same AC LED unit chip. The light emitting modules 210 and 216 of the light emitting unit chips 252, 254, 256 or 258 may have the same circuitry designs, which are shown in FIGS. 2a to 2b and 3a to 3c. A plurality of conductive wires are used to electrically connect the light emitting unit chips 252, 254, 256 or 258, the node 220 and an AC power supply 222b to each other to form the AC LED device 500b. As shown in FIG. 4a, a conductive wire 224a is electrically connected to the node 220 and the first conductive electrode 206 of the AC LED unit chip 252. Conductive wires 224b, 224d, 224f and 224h are respectively and electrically connected to the second conductive electrodes 208 of the AC LED unit chips 252, 254, 256 and 258 and the fourth conductive electrodes 214 of the same AC LED unit chips 252, 254, 256 and 258. Conductive wires 224c, 224e and 224g are respectively and electrically connected to the third conductive electrodes 212 of the AC LED unit chips 252, 254 and 256 and the first conductive electrodes 206 of the adjacent AC LED unit chips 254, 256 and 258. A conductive wire 224i is electrically connected to the third conductive electrodes 212 of the AC LED unit chip 258 and the AC power supply 222b. As shown in FIG. 4a, the AC LED unit chips 252, 254, 256 and 258 are series connected from the AC power supply 222b to the node 220 with the light emitting modules 210 and 216 of each AC LED unit chips 252, 254, 256 and 258 series connected. Therefore, the AC LED device 500b is formed. As mentioned before, driving voltages of the light emitting modules 210 and 216 of each AC LED unit chips 252, 254, 256 and 258 are about 40V, and a peak voltage (Vp) of the AC LED device 500b is about 320V. Therefore, the AC power supply 222b may have a root mean square voltage (Vrms) of about 220V. That is to say, a connection type of the AC LED device 500b may receive 220Vrms of applied voltage by an AC power supply, and nine conductive wires are needed.

Figure 5:
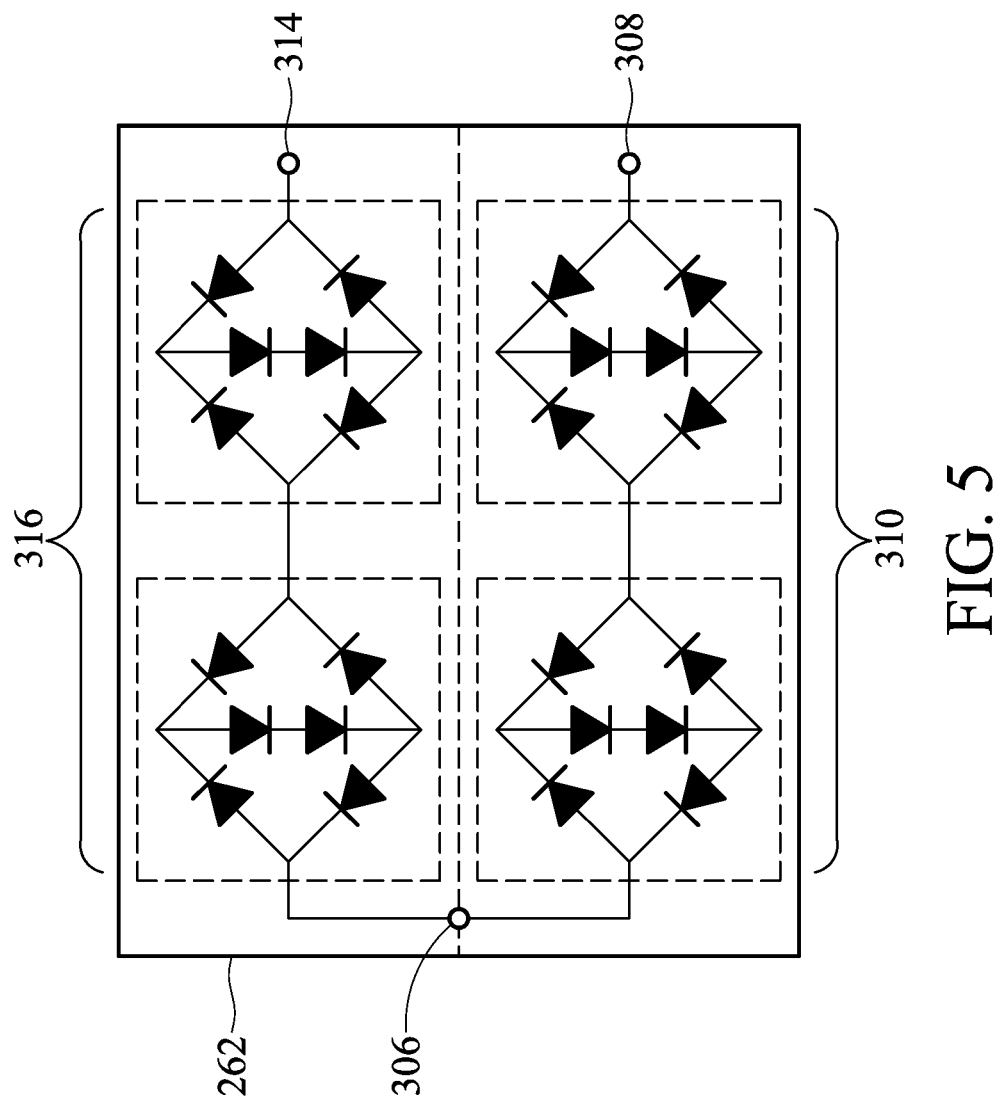
FIG. 5 shows a circuitry design of one exemplary embodiment of an AC LED unit chip as shown in FIGS. 4b and 4c.

FIG. 4b show a connection type of another exemplary embodiment of an AC LED device 500c of the present disclosure. As shown in FIG. 4b, the AC LED device 500c comprises a plurality of separated AC LED unit chips 260, for example, AC LED unit chips 262, 264, 266 and 268. In one embodiment, the AC LED unit chips 262, 264, 266 and 268 may be the same AC LED unit chip. FIG. 5 shows a circuitry design of one exemplary embodiment of an AC LED unit chip 262 as shown in FIGS. 4b and 4c. The light emitting modules 310 and 316 of the light emitting unit chips 262 may have the same circuitry designs as the light emitting modules 210 and 216 as shown in FIG. 3c. Alternatively, the light emitting modules 310 and 316 of the light emitting unit chips 262 may have the same circuitry designs as the light emitting modules 210 and 216 as shown in FIGS. 2a to 2b, 3a and 3b, but not limited to the disclosure herein. As shown in FIG. 5, it is noted that the light emitting modules 310 and 316 of the same light emitting unit chip 262 share the same conductive electrode 306. As shown in FIG. 4b, the light emitting modules 310 and 316 of the same light emitting unit chip, for example, the light emitting unit chip 262, share the same conductive electrode, for example, the first conductive electrode 306. Therefore, the node 220 is electrically connected to the light emitting modules 310 and 316 by only one conductive wire through the first conductive electrode 306 shared by the light emitting modules 310 and 316. Thus, because the amount of conductive wires is reduced, so may costs. Additionally, the light emitting modules 310 and 316 of the light emitting unit chips 262, 264, 266 or 268 may have the same circuitry designs. A plurality of conductive wires are used to electrically connect the light emitting unit chips 262, 264, 266 or 268, the node 220 and an AC power supply 222c to each other to form the AC LED device 500b. A conductive wire 226a is respectively and electrically connected to the node 220 and the first conductive electrode 306 of the AC LED unit chip 262. Conductive wires 226b and 226e are respectively and electrically connected to the second conductive electrodes 308 of the AC LED unit chips 262 and 266 and third conductive electrodes 314 of the adjacent AC LED unit chips 264 and 268. Conductive wires 226c and 226f are respectively and electrically connected to third conductive electrodes 314 of the AC LED unit chips 262 and 266 and second conductive electrodes 308 of the adjacent AC LED unit chips 264 and 268. A conductive wire 226d is electrically connected to the first conductive electrodes 306 of the AC LED unit chip 264 and the adjacent AC LED unit chip 266. A conductive wire 226g is electrically connected to the first conductive electrodes 306 of the AC LED unit chip 268 and the AC power supply 222c. As shown in FIG. 4b, an LED module chain is formed by connecting the light emitting module 316 of the AC LED unit chip 262, the light emitting module 310 of the AC LED unit chip 264, the light emitting module 316 of the AC LED unit chip 266 and the light emitting module 310 of the AC LED unit chip 268 in series. Another LED module chain is formed by connecting the light emitting module 310 of the AC LED unit chip 262, the light emitting module 316 of the AC LED unit chip 264, the light emitting module 310 of the AC LED unit chip 266 and the light emitting module 316 of the AC LED unit chip 268 in series. The described two LED module chains are, parallel connected between the node 220 and the AC power supply 222b. Therefore, the AC LED device 500c is formed. As mentioned before, driving voltages of the light emitting modules 310 and 316 of each AC LED unit chips 262, 264, 266 and 268 are about 40V, and a peak voltage (Vp) of the AC LED device 500c is about 160V. Therefore, the AC power supply 222c may have a root mean square voltage (Vrms) of about 110V. That is to say, a connection type of the AC LED device 500c may receive 110Vrms applied voltage by an AC power supply, and seven conductive wires are needed. When compared with the connection type of the AC LED device 500a as shown in FIG. 1, the AC LED device 500c has less conductive wires. Therefore, the AC LED device 500c may have a lower fabricating cost than the AC LED device 500a.

FIG. 4c show a connection type of another exemplary embodiment of an AC LED device 500d of the present disclosure. Also, FIG. 5 shows a circuitry design of one exemplary embodiment of an AC LED unit chip 262 as shown in FIGS. 4b and 4c. The light emitting modules 310 and 316 of the light emitting unit chips 262 may have the same circuitry designs as the light emitting modules 210 and 216 as shown in FIG. 3c. Alternatively, the light emitting modules 310 and 316 of the light emitting unit chips 262 may have the same circuitry designs as the light emitting modules 210 and 216 as shown in FIGS. 2a to 2b, 3a and 3b, but not limited to the disclosure herein. Similar to the AC LED device 500c, the light emitting modules 310 and 316 of the same light emitting unit chips 262, 264, 266 or 268 share the same conductive electrode 306. Therefore, the light emitting modules 310 and 316 of the same light emitting unit chip, for example, the light emitting unit chip 262, may be series connected without conductive wires. The cost of the conductive wires may be reduced. A plurality of conductive wires are used to electrically connect the light emitting unit chips 262, 264, 266 or 268, the node 220 and an AC power supply 222d to each other to form the AC LED device 500d. As shown in FIG. 4c, a conductive wire 228a is electrically connected to the node 220 and the third conductive electrode 314 of the AC LED unit chip 262. Conductive wires 228b, 228c and 228d are respectively and electrically connected to the second conductive electrodes 308 of the AC LED unit chips 262, 264 and 266 and the third conductive electrodes 314 of the adjacent AC LED unit chips 264, 266 and 268. A conductive wire 228e is electrically connected to the second conductive electrodes 308 of the AC LED unit chip 268 and an AC power supply 222d. Similar to the AC LED device 500b, the AC LED unit chips 262, 264, 266 and 268 are series connected from the AC power supply 222d to the node 220 with the light emitting modules 310 and 316 of each AC LED unit chips 262, 264, 266 and 268 series connected. Therefore, the AC LED device 500d is formed. As mentioned before, driving voltages of the light emitting modules 210 and 216 of each AC LED unit chips 252, 254, 256 and 258 are about 40V, and a peak voltage (Vp) of the AC LED device 500d is about 320V. Therefore, the AC power supply 222b may have a root mean square voltage (Vrms) of about 220V. That is to say, a connection type of the AC LED device 500d may receive 220Vrms applied voltage by an AC power supply, and five conductive wires are needed. When compared with the connection type of the AC LED device 500b as shown in FIG. 4a, the AC LED device 500d has less conductive wires. Therefore, the AC LED device 500d may have a lower fabricating cost than the AC LED device 500b.

The described AC LED device connection types, as shown in FIGS. 1, 4a to 4c, are formed by connecting each light emitting module of each AC LED unit chips in a series or a parallel connection. Alternatively, the amount of AC LED unit chips is according to design to receive different root mean square applied voltages, for example, 90Vrms, 100Vrms, 110Vrms, 132Vrms, 150Vrms, 162Vrms, 240Vrms or 264Vrms. Additionally, each light emitting module of each AC LED unit chip may have various designs to have different driving voltages. Therefore, the AC LED unit chip composed of the light emitting modules may receive different applied voltages.

Figure 6:
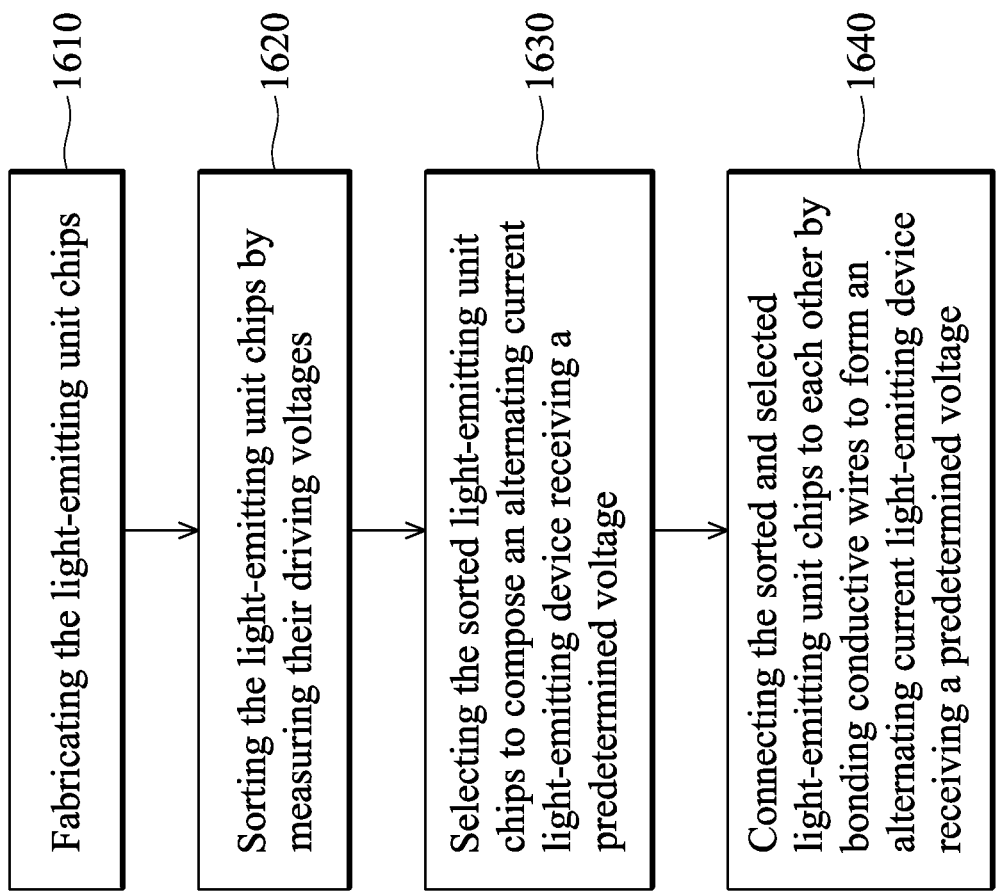
FIG. 6 shows a process chart of fabricating one exemplary embodiment of an AC LED device of the present disclosure.

FIG. 6 shows a process chart of fabricating one exemplary embodiment of an AC LED device of the present disclosure. As shown in step 1610, the step of fabricating the AC LED device comprises fabricating the light emitting unit chips. As shown in step 1620, the light emitting unit chips are sorted by measuring their driving voltages. As shown in step 1630, the sorted light emitting unit chips are selected to compose an AC LED device that receives a predetermined voltage. As shown in step 1640, the selected and sorted light emitting unit chips are connected to each other by bonding conductive wires to form an AC LED device that receives a predetermined voltage. For example, if the driving voltage levels of the sorted light emitting unit chips comprise 36Vrms, 40Vrms and 44Vrms. an AC LED unit chip receiving 160Vrms driving voltage may be composed by connecting two light emitting unit chips of 36Vrms driving voltage and two light emitting unit chips of 44Vrms driving voltage. In another embodiment, the AC LED unit chip receiving 160Vrms driving voltage may be composed by connecting one light emitting unit chip of 36Vrms driving voltage, one light emitting unit chip of 44Vrms driving voltage and two light emitting unit chips of 40Vrms driving voltage. Alternatively, the AC LED unit chip receiving 160Vrms driving voltage may be composed by connecting four light emitting unit chips of 40Vrms driving voltage, but not limited to the disclosure herein. When compared with the conventional AC LED device, whereby all LEDs are arranged in one chip to receive a specific voltage, one exemplary embodiment of an AC LED device composed of one or more AC LED unit chips may receive different applied voltages without requirement to change circuitry designs. Additionally, exemplary embodiments of the AC LED unit chips have smaller driving voltage variations. The AC LED unit chips may be selected and sorted to compose an AC LED device, whereby a predetermined voltage receives and no passive device to adjust applied voltages is required.

While the present disclosure has been described by way of example and in terms of the preferred embodiments, it is to be understood that the present disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An LED device comprising:
   a substrate comprising a first light emitting module, a second light emitting module, a first side, and a second side opposite to the first side;
   wherein the first light emitting module comprises a first conductive electrode located adjacent to the first side, a second conductive electrode located adjacent to the second side, and a first plurality of light emitting micro diodes electrically connected in the form of a plurality of serially connected bridge rectifiers between the first conductive electrode and the second conductive electrode;
   wherein the second light emitting module comprises a third conductive electrode located adjacent to the first side, a fourth conductive electrode adjacent to the second side, and a second plurality of light emitting micro diodes electrically connected in the form of a plurality of serially connected bridge rectifiers between the third conductive electrode and the fourth conductive electrode; and
   wherein the first, second, third, and fourth conductive electrodes are physically separated from each other for bonding to external bonding structures.

2. The LED device as claimed in claim 1, wherein the LED device electrically connects to an alternating current power supply through the external bonding structures.

3. The LED device as claimed in claim 1, wherein the second light emitting module has the same circuitry as the first light emitting module.

4. The LED device as claimed in claim 1, wherein the LED device is devoid of a passive device.

5. The LED device as claimed in claim 1, wherein the first and second light emitting modules are connected in series through one of the external bonding structures.

6. The LED device as claimed in claim 1, wherein the first light emitting module further comprises a first light emitting unit composed of a first part of the light emitting micro diodes coupled in a forward conduction direction from the first conductive electrode to the second conductive electrode, and a second light emitting unit composed of a second part of the light emitting micro diodes coupled in a forward conduction direction from the second conductive electrode to the first conductive electrode.

7. The LED device as claimed in claim 6, wherein the light emitting micro diodes of each light emitting unit are connected in series.

8. The LED device as claimed in claim 1, wherein each of the first and second light emitting modules further comprises a plurality of series-connected light emitting units each composed of at least two light emitting micro diodes, wherein one of the at least two light emitting micro diodes is coupled in a forward conduction direction from the first conductive electrode or the third conductive electrode to the second conductive electrode or the fourth conductive electrode, and another of the at least two light emitting micro diodes is coupled in a forward conduction direction from the second conductive electrode or the fourth conductive electrode to the first conductive electrode or the third conductive electrode.

9. The LED device as claimed in claim 1, wherein the LED device receives a predetermined voltage around 90Vrms, 100Vrms, 110Vrms, 132Vrms, 150Vrms, 162Vrms, 240Vrms or 264Vrms.

\* \* \* \* \*